United States Patent
Lansalot-Matras et al.

(10) Patent No.: US 10,094,021 B2
(45) Date of Patent: Oct. 9, 2018

(54) GROUP 6 TRANSITION METAL-CONTAINING COMPOUNDS FOR VAPOR DEPOSITION OF GROUP 6 TRANSITION METAL-CONTAINING FILMS

(71) Applicant: L'Air Liquide, Société Anonyme pour l'Etude et l'Exploitation des Procédés Georges Claude, Paris (FR)

(72) Inventors: Clément Lansalot-Matras, Princeton, NJ (US); Julien Lieffrig, Seoul (KR); Christian Dussarrat, Tokyo (JP); Antoine Colas, Ozoir la Ferriere (FR); Jong Min Kim, Tsukubamirai (JP)

(73) Assignee: L'Air Liquide, Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 15/503,635

(22) PCT Filed: Aug. 11, 2015

(86) PCT No.: PCT/JP2015/004031
§ 371 (c)(1),
(2) Date: Feb. 13, 2017

(87) PCT Pub. No.: WO2016/024407
PCT Pub. Date: Feb. 18, 2016

(65) Prior Publication Data
US 2017/0268107 A1   Sep. 21, 2017

Related U.S. Application Data

(60) Provisional application No. 62/037,469, filed on Aug. 14, 2014.

(51) Int. Cl.
C23C 16/455 (2006.01)
C23C 16/30 (2006.01)

(52) U.S. Cl.
CPC ........ *C23C 16/45553* (2013.01); *C23C 16/30* (2013.01)

(58) Field of Classification Search
None
See application file for complete search history.

(56) References Cited

U.S. PATENT DOCUMENTS

| 3,920,751 A | 11/1975 | Chabardes et al. |
| 2006/0125099 A1 | 6/2006 | Gordon et al. |

(Continued)

FOREIGN PATENT DOCUMENTS

| JP | S61 36292 | 2/1986 |
| JP | H07 292079 | 11/1995 |

(Continued)

OTHER PUBLICATIONS

US 5,502,228, 03/1996, Bell et al. (withdrawn)

(Continued)

*Primary Examiner* — Joseph Albert Miller, Jr.
(74) *Attorney, Agent, or Firm* — Patricia E. McQueeney (57) ABSTRACT

Disclosed are Group 6 film forming compositions comprising Group 6 transition metal-containing precursors selected from the group consisting of: M(=O)(NR$_2$)$_4$ Formula I, M(=O)$_2$(NR$_2$)$_2$ Formula II, and M(=NR)$_2$(OR)$_2$ Formula III, wherein M is Mo or W and each R is independently H, a C1 to C6 alkyl group, or SiR'$_3$, wherein R' is H or a C1 to C6 alkyl group. Also disclosed are methods of synthesizing and using the disclosed compositions to deposit Group 6 transition metal-containing films on substrates via vapor deposition processes.

19 Claims, 2 Drawing Sheets

(56) References Cited

U.S. PATENT DOCUMENTS

| | | | |
|---|---|---|---|
| 2007/0160761 | A1 | 7/2007 | Reuter et al. |
| 2008/0254232 | A1 | 10/2008 | Gordon et al. |
| 2012/0309162 | A1 | 12/2012 | Chen et al. |
| 2014/0141165 | A1 | 5/2014 | Sato et al. |
| 2014/0187015 | A1 | 7/2014 | Rui et al. |

FOREIGN PATENT DOCUMENTS

| | | |
|---|---|---|
| WO | WO 99 23865 | 5/1999 |
| WO | WO 2008 140578 | 11/2008 |
| WO | WO 2014 143410 | 9/2014 |

OTHER PUBLICATIONS

Inorg Chem Berg 1987 V26-18 p2959-62 (Year: 1987).*

Author unknown, "Synthesis of new compounds: synthesis of [Mo(N$^t$Bu)$_2$(O$^t$Bu)$_2$], 2," Supplemental material for Dalton Transactions, The Royal Society of Chemistry 2003, 5 pages.

Ashrit, P.V., "Dry lithiation study of nanocrystalline, polycrystalline and amorphous tungsten trioxide thin-films," Thin Solid Films 385 (2001) 81-88.

Basato, M. et al., "Amorphous WO$_3$ films via "wet" CVD of a W$^{VI}$ oxoalkoxide precursors," Chem. Vap. Deposition 2001, 7, No. 5, 219-224.

Baxter, D.V. et al., "Chemical vapour deposition of electrochromic tungsten oxide films employing volatile tungsten(VI) oxo alkoxide/ß-diketonate complexes," Chemical Communications (1996) (10) 1129-1130.

Bell, J.M. e al., "large area electrochromic films—preparation and performance," Solar Energy Materials and Solar Cells 68 (2001) 239-247.

Chisholm, M.H. et al., "Facile cleavage of the Mo≡Mo bond in reactions between Mo$_2$(OBu-t)$_6$ and aryl azides and molecular oxygen," J. Am. Chem. Soc. 1981, 103, 1305-1306.

Chisholm, M.H. et al., "Reactions of metal-metal multiple bonds. 10. Reactions of Mo$_2$(OR)$_6$ (M≡M) and [Mo(OR)$_4$]$_x$ compounds with molecular oxygen. Preparation and characterization of oxo alkoxides of molybdenum: MoO$_2$(OR)$_2$, MoO$_2$(OR)$_2$(bpy), MoO(OR)$_4$, Mo$_3$O(OR)$_{10}$, Mo$_4$O$_8$(OR)$_4$(py)$_4$, and Mo$_6$O$_{10}$(OR)$_{12}$," Inorganic Chemistry (1984) 23(8) 1021-37.

Chiu, H.-T. et al., "Deposition of molybdenum carbonitride thin films from Mo(NBut)2(NHBut)2," J. Mat. Res. 9 (7), 1994, 1622-1624.

De Los Arcos, T. et al., "Influence of process parameters on the crystallinity, morphology and composition of tungsten oxide-based thin films grown by metalorganic chemical vapor deposition," Thin Solid Films 522 (2012) 11-16.

Gillaspie. D.T. et al., "Metal-oxide films for electrochromic applications—present technology and future directions," j. Mater. Chem. (2010) 20 9585-9592.

Jolly, M. et al., "Intermetal exchange of oxo, imido and alkylidene ligands," J. Chem. Soc. Dalton trans. 1992, 1331-1332.

Kim, G.-S. et al., "Preparation and properties of dioxomolybdenum alkoxides, phenoxide, and siloxides prepared by the cocondensation reaction of MoO$_3$ with alkoxy- or (aryloxy)silanes," Inorg. Chem. 1989, 28, 1279-1283.

Kirss, R.U. et al., "Chemical vapor deposition of tungsten oxide," Applied Organometallic Chemistry (1998) vol. 12, 155-160.

Li, J. et al., "Enhanced performance of organic light emitting device by insertion of conducting-insulating WO$_3$ Anodic Buffer layer," Synthetic Metals 151 (2005) 141-146.

Meyer, J. et al., "Highly efficient simplified organic light emitting diodes," Applied Physics Letters, 2007, 91, 113506.

Miikkulainen, V. et al., "Atomic layer deposition of molybdenum nitride from bis(tert-butylimido)-bis(dimethylamido)molybdenum and ammonia onto several types of substrate materials with equal growth per cycle," Chem. Mater. 2007, 19, 263-269.

Miikkulainen, V. et al.,"Bis(tert-butylimido)-bis(dialkylamido) complexes of molybdenum as atomic layer deposition (ALD) precursors for molybdenum nitride: the effect of the alkyl group," Chem. Vap. Deposition (2008) 14, 71-77.

Parkin, I.P. et al., "CVD of functional coatings on glass," Chemical Vapour Deposition: Precursors, Processes and Applications, Ch. 10, Section 10.4.3, 464.

Peryshkov, D.V. et al., "Synthesis of tungsten oxo alkylidene complexes," Organometallics 2012, 31, 7278-7286.

Riaz, U., "Low-temperature atmospheric-pressure chemical vapor deposition of tungsten oxide thin films," Thin Solid Films, 235 (1993) 15-16.

Soliman, H.M.A. et al., "Effect of hydrogen peroxide and oxalic acid on electrochromic nanostructured tungsten oxide thin films," Int. J. Electrochem. Sci., 7 (2012) 258-271.

Son, M.J. et al., "Interface electronic structures of organic light-emitting diodes with WO$_3$ interlayer—a study by photoelectron spectroscopy," Organic Electronics 10 (2009) 637-642.

Srinivasan, N.B. et al., "Transition metal nitride thin films grown by MOCVD using amidinato based complexes [M(N$^t$Bu)$_2${$^i$PrN)$_2$CMe}$_2$] (M=Mo, W) as precursors," Surface & Coatings Technology 230 (2013) 130-136.

International Search Report and Written Opinion for corresponding PCT/JP2015/004031, dated Nov. 10, 2015.

International Search Report and Written Opinion for related PCT/JP2015/003422, dated Oct. 13, 2015.

* cited by examiner

GROUP 6 TRANSITION METAL-CONTAINING COMPOUNDS FOR VAPOR DEPOSITION OF GROUP 6 TRANSITION METAL-CONTAINING FILMS

CROSS REFERENCE TO RELATED APPLICATIONS

The present application is a 371 of International PCT Application PCT/JP2015/004031, filed Aug. 11, 2015, which claims the benefit of U.S. Provisional Application Ser. No. 62/037,469 filed Aug. 14, 2014, herein incorporated by reference.

TECHNICAL FIELD

Disclosed are Group 6 film forming compositions comprising Group 6 transition metal-containing precursors. Also disclosed are methods of synthesizing and using the disclosed precursors to deposit Group 6 transition metal-containing films on substrates via vapor deposition processes.

BACKGROUND

Tungsten finds many different applications useful for the fabrication of nano-devices. Deposition of pure tungsten may be used to fill the holes that make contact to the transistor source and drain ("contact holes") and also to fill vias between successive layers of metal. This approach is known as a "tungsten plug" process. The usage of tungsten may be developed due to the good properties of the films deposited using $WF_6$. However, it is necessary to provide an adhesion/barrier layer, such as Ti/TiN, to protect the underlying Si from attack by fluorine and to ensure adhesion of tungsten to the silicon dioxide.

Tungsten-silicide may be used on top of polysilicon gates to increase conductivity of the gate line and thus increase transistor speed. This approach is popular in DRAM fabrication, where the gate is also the word line for the circuit. $WF_6$ and $SiH_4$ may be used, but dichlorosilane ($SiCl_2H_2$) is more commonly employed as the silicon source, since it allows higher deposition temperatures and thus results in lower fluorine concentration in the deposited film.

Tungsten nitride (WN) is considered to be a good barrier against diffusion of copper in microelectronics circuits. WN, may also be used in electrodes for thin-film capacitors and field-effect transistor.

Molybdenum oxide may be used as a thin layer for DRAM capacitors. See, e.g., US2012/309162 or US2014/187015 to Elpida. The molybdenum oxide layer may be deposited on a TiN layer before deposition of a $ZrO_2$ layer. The molybdenum oxide layer may then help increase the deposition rate of the $ZrO_2$ layer. The molybdenum oxide layer may be deposited on the $ZrO_2$ layer and a TiN layer deposited on the molybdenum oxide layer producing a TiN/$MoO_x$/$ZrO_2$/$MoO_x$/TiN stack. The molybdenum oxide layers in the stack may reduce leakage current.

Electrochromic devices are optoelectrochemical systems that change their optical properties, essentially their transmittance, when a voltage is applied. As a result, the optoelectrochemical systems may be used in many applications, such as, but not limited to, smart windows, sunroofs, shades, visors or rear view mirrors, flat panel displays for automotive, architectural, display, and optoelectrical applications like skylights, panel displays, aquariums, light filters and screens for light pipes and other optoelectrical devices. Transition metal oxides have been used as inorganic electrochromic materials. Among those transition metal oxides, tungsten trioxide, $WO_3$, an n-type semiconductor, is one of the most extensively studied materials due to its electrochromic properties in the visible and infrared region, high coloration efficiency, and relatively low price. The color of $WO_3$ changes from transparent or yellow to deep blue when it is reduced under cathodic polarization.

Organic Light Emitting Diode (OLED) devices involve emission of light at a specific wavelength range when a voltage is applied. The use of transition metal oxides as the electrode interface modification layer at anode and cathode in OLEDs has also been reported for reducing the operational voltage, one of the main parameter to improve device reliability. Among those transition metal oxides, tungsten oxide or molybdenum oxide as an anode buffer layer offers advantages such as very high transparent in the visible region and energy level matching with organic molecules. (Applied Physics Letters, 2007, 91, 113506).

JP07-292079 discloses metathesis catalyst precursors having the formula $M(Y)(OR^2)_x(R^3)_y(X)_zL_s$, wherein M is Mo or W; Y is =O or =$NR^1$; $R^1$, $R^2$, and $R^3$ is alkyl, cycloalkyl, cycloalkenyl, polycycloalkyl, polycycloalkenyl, haloalkyl, haloaralkyl, (un)substituted aralkyl, arom. groups containing Si; X=halogen; L=Lewis base; s=0 or 1; x+y+z=4; and y≥1. The catalyst precursor is synthesized from $M(Y)(OR^2)_4$, such as $W(=O)(OCH_2tBu)_4$.

Chisholm et al. disclose preparation and characterization of oxo alkoxides of molybdenum. Inorganic Chemistry (1984) 23(8) 1021-37.

WO2014/143410 to Kinestral Technologies Inc. discloses multi-layer electrochromic structures comprising an anodic electrochromic layer comprising lithium, nickel, and a Group 6 metal selected from Mo, W, and combinations thereof. Abstract. Para 0107 discloses that the source (starting) material for the Group 6 metal may be $(RO)_4MO$.

David Baxter et al. Chemical Communications (1996), (10), 1129-1130 describes the use of different tungsten(VI) oxo alkoxides and tungsten(VI) oxo alkoxide β-diketonate complexes that are volatile precursors for low-pressure CVD of tungsten oxide electrochromic films. However, the molecules may be solid, difficult to purify effectively, or costly to prepare due to relatively high number of synthesis steps.

WO99/23865 to Sustainable Technologies Australia Ltd. discloses that synthesis of tungsten (VI) oxo-tetra-alkoxide [WO(OR)$_4$] from $WOCl_4$, alcohol and ammonia produces an insoluble tungsten-containing compound. WO99/23865 discloses that excess ammonia can be added to dissolve the precipitated tungsten compound, but that the final tungsten oxide obtained is unsuitable as a film for electrochromic applications.

M. Basato et al. Chemical Vapor Deposition (2001), 7(5), 219-224 also describes the use of W(=O)(OtBu)$_4$ by self-evaporation, in combination with $H_2O$, to form $WO_3$ material at 100-150 C.

J. M. Bell et al. describe the preparation of tungsten oxide film for electrochromic devices using W(=O)(OnBu)$_4$ (Solar Energy Materials and Solar Cells, 2001, 68, 239).

Dmitry V. Peryshkov and Richard R. Schrock describe the preparation of W(=O)(OtBu)$_4$ from W(=O)Cl$_4$ and Li(OtBu). Organometallics 2012, 31, 7278-7286.

Parkin et al. disclose CVD of Functional Coatings on Glass in Chapter 10 of

Chemical Vapour Deposition: Precursors, Processes and Applications. Section 10.4.3 discloses that several tungsten alkoxides, oxo alkoxides, and aryl oxides have been investigated, such as WO(OR)$_4$, wherein R=Me, Et, iPr, and Bu. Parkin et al. note that these precursors provide a single source precursor, with no need for a second oxygen precursor. Parkin et al. note that these precursors suffer from low volatility.

U.S. Pat. No. 7,560,581B2 discloses the use of the bis-alkylimido bis-dialkylamino tungsten precursors for the production of tungsten nitride in ALD mode with or without plasma for copper barrier diffusion applications.

Miikkulainen et al. disclose ALD deposition using $Mo(NR)_2(NR'_2)_2$ precursors. Chem Mater. (2007), 19, 263-269; Chem. Vap. Deposition (2008) 14, 71-77. Chiu et al. disclose CVD deposition of MoN using $Mo(NtBu)_2(NHtBu)_2$. J. Mat. Res. 9 (7), 1994, 1622-1624.

A need remains for developing novel, liquid or low melting point (<50° C.), highly thermally stable, Group 6 precursor molecules suitable for vapor phase thin film deposition with controlled thickness and composition at high temperature.

<Notation and Nomenclature>

Certain abbreviations, symbols, and terms are used throughout the following description and claims, and include:

As used herein, "Group 6" refers to column 6 of the Periodic Table, containing Cr, Mo, and W.

As used herein, the indefinite article "a" or "an" means one or more.

As used herein, the terms "approximately" or "about" mean ±10% of the value stated.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1{}_x$, $(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

As used herein, the term "alkyl group" refers to saturated functional groups containing exclusively carbon and hydrogen atoms. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to a propyl group; the abbreviation "nPr" refers to a "normal" or linear propyl group; the abbreviation "iPr" refers to an isopropyl group; the abbreviation "Bu" refers to a butyl group; the abbreviation "nBu" refers to a "normal" or linear butyl group; the abbreviation "tBu" refers to a tert-butyl group, also known as 1,1-dimethylethyl; the abbreviation "sBu" refers to a sec-butyl group, also known as 1-methylpropyl; the abbreviation "iBu" refers to an iso-butyl group, also known as 2-methylpropyl; the abbreviation "amyl" refers to an amyl or pentyl group; the abbreviation "tAmyl" refers to a tert-amyl group, also known as 1,1-dimethylpropyl.

The standard abbreviations of the elements from the periodic table of elements are used herein. It should be understood that elements may be referred to by these abbreviations (e.g., Mn refers to manganese, Si refers to silicon, C refers to carbon, etc.).

SUMMARY

Disclosed are Group 6 film forming compositions comprising Group 6 transition metal-containing precursors selected from the group consisting of:

| | |
|---|---:|
| $M(=O)(NR_2)_4$ | Formula I, |
| $M(=O)_2(NR_2)_2$ | Formula II, |
| $M(=NR)_2(OR)_2$ | Formula III, |
| $M(=O)(OR)_4$ | Formula IV, and |
| $M(=O)_2(OR)_2$ | Formula V, | wherein M is Mo or W and each R is independently H, a C1 to C6 alkyl group, or $SiR'_3$, wherein R' is H or a C1 to C6 alkyl group. The disclosed precursors may include one or more of the following aspects:

M being Mo;
M being W;
the precursor having the formula $M(=O)(NR_2)_4$;
each R independently being selected from H, Me, Et, nPr, iPr, tBu, sBu, iBu, nBu, tAmyl, $SiMe_3$, $SiMe_2H$, or $SiH_2Me$;
each R independently being selected from H, Me, Et, iPr, or tBu;
the precursor being $Mo(=O)(NMe_2)_4$;
the precursor being $Mo(=O)(NMeEt)_4$;
the precursor being $Mo(=O)(NEt_2)_4$;
the precursor being $Mo(=O)(NiPr_2)_4$;
the precursor being $Mo(=O)(NnPr_2)_4$;
the precursor being $Mo(=O)(NiBu_2)_4$;
the precursor being $Mo(=O)(NnBu_2)_4$;
the precursor being $Mo(=O)(NtBu_2)_4$;
the precursor being $Mo(=O)(NsBu_2)_4$;
the precursor being $Mo(=O)(NtAm_2)_4$;
the precursor being $Mo(=O)(NMe_2)_2(NtBu_2)_2$;
the precursor being $Mo(=O)(NiPr_2)_2(NtBu_2)_2$;
the precursor being $Mo(=O)(N(SiMe_3)_2)_4$;
the precursor being $Mo(=O)(N(SiHMe_2)_2)_4$;
the precursor being $Mo(=O)(N(SiMeH_2)_2)_4$;
the precursor being $Mo(=O)(NHMe)_4$;
the precursor being $Mo(=O)(NHEt)_4$;
the precursor being $Mo(=O)(NHiPr)_4$;
the precursor being $Mo(=O)(NHnPr)_4$;
the precursor being $Mo(=O)(NHiBu)_4$;
the precursor being $Mo(=O)(NHnBu)_4$;
the precursor being $Mo(=O)(NHtBu)_4$;
the precursor being $Mo(=O)(NHsBu)_4$;
the precursor being $Mo(=O)(NHtAm)_4$;
the precursor being $Mo(=O)(NHMe)_2(NtBu_2)_2$;
the precursor being $Mo(=O)(NiPr_2)_2(NHtBu)_2$;
the precursor being $Mo(=O)(NHSiMe_3)_4$;
the precursor being $Mo(=O)(NH(SiHMe_2))_4$;
the precursor being $Mo(=O)(NH(SiMeH_2))_4$;
the precursor being $Mo(=O)(NHiPr)_2(N(SiMe_3)_2)_2$;
the precursor being $Mo(=O)(NiPr_2)_2(N(SiMe_3)_2)_2$;
the precursor being $W(=O)(NMe_2)_4$;
the precursor being $W(=O)(NMeEt)_4$;
the precursor being $W(=O)(NEt_2)_4$;
the precursor being $W(=O)(NiPr_2)_4$;
the precursor being $W(=O)(NnPr_2)_4$;
the precursor being $W(=O)(NiBu_2)_4$;

the precursor being W(=O)(NnBu$_2$)$_4$;
the precursor being W(=O)(NtBu$_2$)$_4$;
the precursor being W(=O)(NsBu$_2$)$_4$;
the precursor being W(=O)(NtAm$_2$)$_4$;
the precursor being W(=O)(NMe$_2$)$_2$(NtBu$_2$)$_2$;
the precursor being W(=O)(NiPr$_2$)$_2$(NtBu$_2$)$_2$;
the precursor being W(=O)(N(SiMe$_3$)$_2$)$_4$;
the precursor being W(=O)(N(SiHMe$_2$)$_2$)$_4$;
the precursor being W(=O)(N(SiMeH$_2$)$_2$)$_4$;
the precursor being W(=O)(NHMe)$_4$;
the precursor being W(=O)(NHEt)$_4$;
the precursor being W(=O)(NHiPr)$_4$;
the precursor being W(=O)(NHnPr)$_4$;
the precursor being W(=O)(NHiBu)$_4$;
the precursor being W(=O)(NHnBu)$_4$;
the precursor being W(=O)(NHtBu)$_4$;
the precursor being W(=O)(NHsBu)$_4$;
the precursor being W(=O)(NHtAm)$_4$;
the precursor being W(=O)(NHMe)$_2$(NtBu$_2$)$_2$;
the precursor being W(=O)(NiPr$_2$)$_2$(NHtBu)$_2$;
the precursor being W(=O)(NHSiMe$_3$)$_4$;
the precursor being W(=O)(NH(SiHMe$_2$))$_4$;
the precursor being W(=O)(NH(SiMeH$_2$))$_4$;
the precursor being W(=O)(NHiPr)$_2$(N(SiMe$_3$)$_2$)$_2$;
the precursor being W(=O)(NiPr$_2$)$_2$(N(SiMe$_3$)$_2$)$_2$;
the precursor having the formula M(=O)$_2$(NR$_2$)$_2$;
the precursor being Mo(=O)$_2$(NMe$_2$)$_2$;
the precursor being Mo(=O)$_2$(NMeEt)$_2$;
the precursor being Mo(=O)$_2$(NEt$_2$)$_2$;
the precursor being Mo(=O)$_2$(NiPr$_2$)$_2$;
the precursor being Mo(=O)$_2$(NnPr$_2$)$_2$;
the precursor being Mo(=O)$_2$(NiBu$_2$)$_2$;
the precursor being Mo(=O)$_2$(NnBu$_2$)$_2$;
the precursor being Mo(=O)$_2$(NtBu$_2$)$_2$;
the precursor being Mo(=O)$_2$(NsBu$_2$)$_2$;
the precursor being Mo(=O)$_2$(NtAm$_2$)$_2$;
the precursor being Mo(=O)$_2$(NMe$_2$)(NtBu$_2$);
the precursor being Mo(=O)$_2$(NiPr$_2$)(NtBu$_2$);
the precursor being Mo(=O)$_2$(N(SiMe$_3$)$_2$)$_2$;
the precursor being Mo(=O)$_2$(N(SiHMe$_2$)$_2$)$_2$;
the precursor being Mo(=O)$_2$(N(SiMeH$_2$)$_2$)$_2$;
the precursor being Mo(=O)$_2$(NHMe)$_2$;
the precursor being Mo(=O)$_2$(NHEt)$_2$;
the precursor being Mo(=O)$_2$(NHiPr)$_2$;
the precursor being Mo(=O)$_2$(NHnPr)$_2$;
the precursor being Mo(=O)$_2$(NHiBu)$_2$;
the precursor being Mo(=O)$_2$(NHnBu)$_2$;
the precursor being Mo(=O)$_2$(NHtBu)$_2$;
the precursor being Mo(=O)$_2$(NHsBu)$_2$;
the precursor being Mo(=O)$_2$(NHtAm)$_2$;
the precursor being Mo(=O)$_2$(NHMe)(NtBu$_2$);
the precursor being Mo(=O)$_2$(NiPr$_2$)(NHtBu);
the precursor being Mo(=O)$_2$(NHSiMe$_3$)$_2$;
the precursor being Mo(=O)$_2$(NH(SiHMe$_2$))$_2$;
the precursor being Mo(=O)$_2$(NH(SiMeH$_2$))$_2$;
the precursor being Mo(=O)$_2$(NHiPr)(N(SiMe$_3$)$_2$);
the precursor being Mo(=O)$_2$(NiPr$_2$)(N(SiMe$_3$)$_2$);
the precursor being W(=O)$_2$(NMe$_2$)$_2$;
the precursor being W(=O)$_2$(NMeEt)$_2$;
the precursor being W(=O)$_2$(NEt$_2$)$_2$;
the precursor being W(=O)$_2$(NiPr$_2$)$_2$;
the precursor being W(=O)$_2$(NnPr$_2$)$_2$;
the precursor being W(=O)$_2$(NiBu$_2$)$_2$;
the precursor being W(=O)$_2$(NnBu$_2$)$_2$;
the precursor being W(=O)$_2$(NtBu$_2$)$_2$;
the precursor being W(=O)$_2$(NsBu$_2$)$_2$;
the precursor being W(=O)$_2$(NtAm$_2$)$_2$;
the precursor being W(=O)$_2$(NMe$_2$)(NtBu$_2$);
the precursor being W(=O)$_2$(NiPr$_2$)(NtBu$_2$);
the precursor being W(=O)$_2$(N(SiMe$_3$)$_2$)$_2$;
the precursor being W(=O)$_2$(N(SiHMe$_2$)$_2$)$_2$;
the precursor being W(=O)$_2$(N(SiMeH$_2$)$_2$)$_2$;
the precursor being W(=O)$_2$(NHMe)$_2$;
the precursor being W(=O)$_2$(NHEt)$_2$;
the precursor being W(=O)$_2$(NHiPr)$_2$;
the precursor being W(=O)$_2$(NHnPr)$_2$;
the precursor being W(=O)$_2$(NHiBu)$_2$;
the precursor being W(=O)$_2$(NHnBu)$_2$;
the precursor being W(=O)$_2$(NHtBu)$_2$;
the precursor being W(=O)$_2$(NHsBu)$_2$;
the precursor being W(=O)$_2$(NHtAm)$_2$;
the precursor being W(=O)$_2$(NHMe)(NtBu$_2$);
the precursor being W(=O)$_2$(NiPr$_2$)(NHtBu);
the precursor being W(=O)$_2$(NHSiMe$_3$)$_2$;
the precursor being W(=O)$_2$(NH(SiHMe$_2$))$_2$;
the precursor being W(=O)$_2$(NH(SiMeH$_2$))$_2$;
the precursor being W(=O)$_2$(NHiPr)(N(SiMe$_3$)$_2$);
the precursor being W(=O)$_2$(NiPr$_2$)(N(SiMe$_3$)$_2$);
the precursor having the formula M(=NR)$_2$(OR)$_2$;
the precursor being Mo(=NMe)$_2$(OMe)$_2$;
the precursor being Mo(=NEt)$_2$(OEt)$_2$;
the precursor being Mo(=NiPr)$_2$(OiPr)$_2$;
the precursor being Mo(=NnPr)$_2$(OnPr)$_2$;
the precursor being Mo(=NiBu)$_2$(OiBu)$_2$;
the precursor being Mo(=NsBu)$_2$(OsBu)$_2$;
the precursor being Mo(=NtBu)$_2$(OtBu)$_2$;
the precursor being Mo(=NnBu)$_2$(OnBu)$_2$;
the precursor being Mo(=NtAm)$_2$(OtAm)$_2$;
the precursor being Mo(=NSiMe$_3$)$_2$(OSiMe$_3$)$_2$;
the precursor being Mo(=NSiHMe$_2$)$_2$(OSiHMe$_2$)$_2$;
the precursor being Mo(=NSiH$_2$Me)$_2$(OSiH$_2$Me)$_2$;
the precursor being Mo(=NMe)$_2$(OtBu)$_2$;
the precursor being Mo(=NEt)$_2$(OiPr)$_2$;
the precursor being Mo(=NiPr)$_2$(OMe)$_2$;
the precursor being Mo(=NiPr)$_2$(OEt)$_2$;
the precursor being Mo(=NiPr)$_2$(OtBu)$_2$;
the precursor being Mo(=NiPr)$_2$(OsBu)$_2$;
the precursor being Mo(=NiPr)$_2$(OiBu)$_2$;
the precursor being Mo(=NiPr)$_2$(OnBu)$_2$;
the precursor being Mo(=NiPr)$_2$(OtAmyl)$_2$;
the precursor being Mo(=NiPr)$_2$(OSiMe$_3$)$_2$;
the precursor being Mo(=NtBu)$_2$(OMe)$_2$;
the precursor being Mo(=NtBu)$_2$(OEt)$_2$;
the precursor being Mo(=NtBu)$_2$(OiPr)$_2$;
the precursor being Mo(=NtBu)$_2$(OsBu)$_2$;
the precursor being Mo(=NtBu)$_2$(OiBu)$_2$;
the precursor being Mo(=NtBu)$_2$(OnBu)$_2$;
the precursor being Mo(=NtBu)$_2$(OtAmyl)$_2$;
the precursor being Mo(=NtAm)$_2$(OMe)$_2$;
the precursor being Mo(=NtAm)$_2$(OEt)$_2$;
the precursor being Mo(=NtAm)$_2$(OiPr)$_2$;
the precursor being Mo(=NtAm)$_2$(OtBu)$_2$;
the precursor being Mo(=NtAm)$_2$(OsBu)$_2$;
the precursor being Mo(=NtAm)$_2$(OiBu)$_2$;
the precursor being Mo(=NtAm)$_2$(OnBu)$_2$;
the precursor being Mo(=NSiMe$_3$)$_2$(OMe)(OEt);
the precursor being Mo(=NSiHMe$_2$)$_2$(OMe)(OEt);
the precursor being Mo(=NSiH$_2$Me)$_2$(OMe)(OEt);
the precursor being Mo(=NSiMe$_3$)(=NtBu)(OMe)$_2$;
the precursor being Mo(=NSiMe$_3$)(=NtBu)(OEt)$_2$;
the precursor being Mo(=NSiMe$_3$)(=NiPr)(OMe)$_2$;
the precursor being Mo(=NSiMe$_3$)(=NiPr)(OEt)$_2$;
the precursor being W(=NMe)$_2$(OMe)$_2$;
the precursor being W(=NEt)$_2$(OEt)$_2$;

the precursor being W(=NiPr)$_2$(OiPr)$_2$;
the precursor being W(=NnPr)$_2$(OnPr)$_2$;
the precursor being W(=NiBu)$_2$(OiBu)$_2$;
the precursor being W(=NsBu)$_2$(OsBu)$_2$;
the precursor being W(=NtBu)$_2$(OtBu)$_2$;
the precursor being W(=NnBu)$_2$(OnBu)$_2$;
the precursor being W(=NtAm)$_2$(OtAm)$_2$;
the precursor being W(=NSiMe$_3$)$_2$(OSiMe$_3$)$_2$;
the precursor being W(=NSiHMe$_2$)$_2$(OSiHMe$_2$)$_2$;
the precursor being W(=NSiH$_2$Me)$_2$(OSiH$_2$Me)$_2$;
the precursor being W(=NMe)$_2$(OtBu)$_2$;
the precursor being W(=NEt)$_2$(OiPr)$_2$;
the precursor being W(=NiPr)$_2$(OMe)$_2$;
the precursor being W(=NiPr)$_2$(OEt)$_2$;
the precursor being W(=NtBu)$_2$(OMe)$_2$;
the precursor being W(=NtBu)$_2$(OEt)$_2$;
the precursor being W(=NtAm)$_2$(OMe)$_2$;
the precursor being W(=NtAm)$_2$(OEt)$_2$;
the precursor being W(=NSiMe$_3$)$_2$(OMe)(OEt);
the precursor being W(=NSiHMe$_2$)$_2$(OMe)(OEt);
the precursor being W(=NSiH$_2$Me)$_2$(OMe)(OEt);
the precursor being W(=NSiMe$_3$)(=NtBu)(OMe)$_2$;
the precursor being W(=NSiMe$_3$)(=NtBu)(OEt)$_2$;
the precursor being W(=NSiMe$_3$)(=NiPr)(OMe)$_2$;
the precursor being W(=NSiMe$_3$)(=NiPr)(OEt)$_2$;
the precursor having the formula M(=O)(OR)$_4$;
each R independently being selected from H, Me, Et, nPr, iPr, tBu, sBu, iBu, nBu, tAmyl, SiMe$_3$, SiMe$_2$H, or SiH$_2$Me;
each R independently being iPr or tBu;
the precursor being Mo(=O)(OMe)$_4$;
the precursor being Mo(=O)(OEt)$_4$;
the precursor being Mo(=O)(OiPr)$_4$;
the precursor being Mo(=O)(OnPr)$_4$;
the precursor being Mo(=O)(OiBu)$_4$;
the precursor being Mo(=O)(OnBu)$_4$;
the precursor being Mo(=O)(OtBu)$_4$;
the precursor being Mo(=O)(OsBu)$_4$;
the precursor being Mo(=O)(OtAm)$_4$;
the precursor being Mo(=O)(OMe)$_2$(OtBu)$_2$;
the precursor being Mo(=O)(OiPr)$_2$(OtBu)$_2$;
the precursor being Mo(=O)(OSiMe$_3$)$_4$;
the precursor being Mo(=O)(OSiHMe$_2$)$_4$;
the precursor being Mo(=O)(OSiMeH$_2$)$_4$;
the precursor being Mo(=O)(OiPr)$_2$(OSiMe$_3$)$_2$;
the precursor being W(=O)(OMe)$_4$;
the precursor being W(=O)(OnPr)$_4$;
the precursor being W(=O)(OiBu)$_4$;
the precursor being W(=O)(OnBu)$_4$;
the precursor being W(=O)(OsBu)$_4$;
the precursor being W(=O)(OtAm)$_4$;
the precursor being W(=O)(OMe)$_2$(OtBu)$_2$;
the precursor being W(=O)(OiPr)$_2$(OtBu)$_2$;
the precursor being W(=O)(OSiMe$_3$)$_4$;
the precursor being W(=O)(OSiHMe$_2$)$_4$;
the precursor being W(=O)(OSiMeH$_2$)$_4$;
the precursor being W(=O)(OiPr)$_2$(OSiMe$_3$)$_2$;
the precursor having the formula M(=O)$_2$(OR)$_2$;
each R independently being selected from H, Me, Et, nPr, iPr, tBu, sBu, iBu, nBu, tAmyl, SiMe$_3$, SiMe$_2$H, or SiH$_2$Me;
each R independently being iPr or tBu;
the precursor being Mo(=O)$_2$(OMe)$_2$;
the precursor being Mo(=O)$_2$(OEt)$_2$;
the precursor being Mo(=O)$_2$(OiPr)$_2$;
the precursor being Mo(=O)$_2$(OnPr)$_2$;
the precursor being Mo(=O)$_2$(OiBu)$_2$;
the precursor being Mo(=O)$_2$(OnBu)$_2$;
the precursor being Mo(=O)$_2$(OtBu)$_2$;
the precursor being Mo(=O)$_2$(OsBu)$_2$;
the precursor being Mo(=O)$_2$(OtAm)$_2$;
the precursor being Mo(=O)$_2$(OMe)(OtBu);
the precursor being Mo(=O)$_2$(OiPr)(OtBu);
the precursor being Mo(=O)$_2$(OSiMe$_3$)$_2$;
the precursor being Mo(=O)$_2$(OSiHMe$_2$)$_2$;
the precursor being Mo(=O)$_2$(OSiMeH$_2$)$_2$;
the precursor being Mo(=O)$_2$(OiPr)(OSiMe$_3$);
the precursor being W(=O)$_2$(OMe)$_2$;
the precursor being W(=O)$_2$(OEt)$_2$;
the precursor being W(=O)$_2$(OnPr)$_2$;
the precursor being W(=O)$_2$(OiPr)$_2$;
the precursor being W(=O)$_2$(OiBu)$_2$;
the precursor being W(=O)$_2$(OnBu)$_2$;
the precursor being W(=O)$_2$(OsBu)$_2$;
the precursor being W(=O)$_2$(OtBu)$_2$;
the precursor being W(=O)$_2$(OtAm)$_2$;
the precursor being W(=O)$_2$(OMe)(OtBu);
the precursor being W(=O)$_2$(OiPr)(OtBu);
the precursor being W(=O)$_2$(OSiMe$_3$)$_2$;
the precursor being W(=O)$_2$(OSiHMe$_2$)$_2$;
the precursor being W(=O)$_2$(OSiMeH$_2$)$_2$;
the precursor being W(=O)$_2$(OiPr)(OSiMe$_3$);
the composition comprising between approximately 95% w/w and approximately 100% w/w of the precursor;
the composition comprising between approximately 98% w/w and approximately 100% w/w of the precursor;
the composition comprising between approximately 99% w/w and approximately 100% w/w of the precursor;
the composition comprising between approximately 0.1% w/w and approximately 50% w/w of the precursor;
the composition comprising between approximately 0 atomic % and 5 atomic % of M(OR)$_6$;
the composition comprising between approximately 0 atomic % and 5 atomic % of M(=NR)$_2$Cl(OR);
the composition comprising between approximately 0 ppmw and 200 ppm of Cl; further comprising a solvent.
the solvent being selected from the group consisting of C1-C16 hydrocarbons, THF, DMO, ether, pyridine, and combinations thereof;
the solvent being a C1-C16 hydrocarbons;
the solvent being tetrahydrofuran (THF);
the solvent being dimethyl oxalate (DMO);
the solvent being ether;
the solvent being pyridine;
the solvent being ethanol; and
the solvent being isopropanol.

Also disclosed are processes for the deposition of Group 6 transition metal-containing films on substrates. The Group 6 film forming compositions disclosed above is introduced into a reactor having a substrate disposed therein. At least part of the Group 6 transition metal-containing precursor is deposited onto the substrate to form the Group 6 transition metal-containing film. The disclosed processes may further include one or more of the following aspects:
introducing at least one reactant into the reactor;
the reactant being plasma-treated;
the reactant being remote plasma-treated;
the reactant not being plasma-treated;
the reactant being selected from the group consisting of H$_2$, H$_2$CO, N$_2$H$_4$, NH$_3$, SiH$_4$, Si$_2$H$_6$, Si$_3$H$_8$, SiH$_2$Me$_2$, SiH$_2$Et$_2$, N(SiH$_3$)$_3$, hydrogen radicals thereof, and mixtures thereof;
the reactant being H$_2$;
the reactant being NH$_3$;

the reactant being selected from the group consisting of: $O_2$, $O_3$, $H_2O$, $H_2O_2$, NO, $N_2O$, $NO_2$, oxygen radicals thereof, and mixtures thereof;
the reactant being $H_2O$;
the reactant being plasma treated $O_2$;
the reactant being $O_3$;
the Group 6 film forming composition and the reactant being introduced into the reactor simultaneously;
the reactor being configured for chemical vapor deposition;
the reactor being configured for plasma enhanced chemical vapor deposition;
the Group 6 film forming composition and the reactant being introduced into the chamber sequentially;
the reactor being configured for atomic layer deposition;
the reactor being configured for plasma enhanced atomic layer deposition;
the reactor being configured for spatial atomic layer deposition;
the Group 6 transition metal-containing film being a pure Group 6 transition metal thin film;
the Group 6 transition metal-containing film being a Group 6 transition metal silicide ($M_kSi_l$, wherein M is the Group 6 transition metal and each of k and l is an integer which inclusively range from 1 to 6);
the Group 6 transition metal-containing film being a Group 6 transition metal oxide ($M_nO_m$, wherein M is the Group 6 transition metal and each of n and m is an integer which inclusively range from 1 to 6);
the Group 6 transition metal-containing film being $MoO_2$, $MoO_3$, $W_2O_3$, $WO_2$, $WO_3$, or $W_2O_5$;
the Group 6 transition metal-containing film being a Group 6 transition metal nitride ($M_oN_p$, wherein M is the Group 6 transition metal and each of o and p is an integer which inclusively range from 1 to 6); and
the Group 6 transition metal-containing film being $Mo_2N$, MoN, $MoN_2$, $W_2N$, WN, or $WN_2$.

BRIEF DESCRIPTION OF DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF EMBODIMENTS

Disclosed are Group 6 film forming compositions comprising Group 6 transition metal-containing precursors selected from the group consisting of:

M(=O)(NR$_2$)$_4$      Formula I,

M(=O)$_2$(NR$_2$)$_2$      Formula II,

M(=NR)$_2$(OR)$_2$      Formula III,

M(=O)(OR)$_4$      Formula IV, and

M(=O)$_2$(OR)$_2$      Formula V, wherein M is Mo or W and each R is independently H, a C1 to C6 alkyl group, or SiR'$_3$, wherein R' is H or a C1 to C6 alkyl group.

The Group 6 transition metal-containing precursor may have Formula I, M(=O)(NR$_2$)$_4$, wherein M is Mo or W and each R is independently H, a C1 to C6 alkyl group, or SiR'$_3$, wherein R' is H or a C1 to C6 alkyl group. Preferably, each R is independently H, Me, Et, iPr, or tBu.

Exemplary molybdenum precursors of Formula I include Mo(=O)(NMe$_2$)$_4$, Mo(=O)(NMeEt)$_4$, Mo(=O)(NEt$_2$)$_4$, Mo(=O)(NiPr$_2$)$_4$, Mo(=O)(NnPr$_2$)$_4$, Mo(=O)(NiBu$_2$)$_4$, Mo(=O)(NnBu$_2$)$_4$, Mo(=O)(NtBu$_2$)$_4$, Mo(=O)(NsBu$_2$)$_4$, Mo(=O)(NtAm$_2$)$_4$, Mo(=O)(NMe$_2$)$_2$(NtBu$_2$)$_2$, Mo(=O)(NiPr$_2$)$_2$(NtBu$_2$)$_2$, Mo(=O)(N(SiMe$_3$)$_2$)$_4$, Mo(=O)(N(SiHMe$_2$)$_2$)$_4$, Mo(=O)(N(SiMeH$_2$)$_2$)$_4$, Mo(=O)(NHMe)$_4$, Mo(=O)(NHEt)$_4$, Mo(=O)(NHiPr)$_4$, Mo(=O)(NHnPr)$_4$, Mo(=O)(NHiBu)$_4$, Mo(=O)(NHnBu)$_4$, Mo(=O)(NHtBu)$_4$, Mo(=O)(NHsBu)$_4$, Mo(=O)(NHtAm)$_4$, Mo(=O)(NHMe)$_2$(NtBu$_2$)$_2$, Mo(=O)(NiPr$_2$)$_2$(NHtBu)$_2$, Mo(=O)(NHSiMe$_3$)$_4$, Mo(=O)(NH(SiHMe$_2$))$_4$, Mo(=O)(NH(SiMeH$_2$))$_4$, Mo(=O)(NHiPr)$_2$(N(SiMe$_3$)$_2$)$_2$, and Mo(=O)(NiPr$_2$)$_2$(N(SiMe$_3$)$_2$)$_2$.

Exemplary tungsten precursors of Formula I include W(=O)(NMe$_2$)$_4$, W(=O)(NMeEt)$_4$, W(=O)(NEt$_2$)$_4$, W(=O)(NiPr$_2$)$_4$, W(=O)(NnPr$_2$)$_4$, W(=O)(NiBu$_2$)$_4$, W(=O)(NnBu$_2$)$_4$, W(=O)(NtBu$_2$)$_4$, W(=O)(NsBu$_2$)$_4$, W(=O)(NtAm$_2$)$_4$, W(=O)(NMe$_2$)$_2$(NtBu$_2$)$_2$, W(=O)(NiPr$_2$)$_2$(NtBu$_2$)$_2$, W(=O)(N(SiMe$_3$)$_2$)$_4$, W(=O)(N(SiHMe$_2$)$_2$)$_4$, W(=O)(N(SiMeH$_2$)$_2$)$_4$, W(=O)(NHMe)$_4$, W(=O)(NHEt)$_4$, W(=O)(NHiPr)$_4$, W(=O)(NHnPr)$_4$, W(=O)(NHiBu)$_4$, W(=O)(NHnBu)$_4$, W(=O)(NHtBu)$_4$, W(=O)(NHsBu)$_4$, W(=O)(NHtAm)$_4$, W(=O)(NHMe)$_2$(NtBu$_2$)$_2$, W(=O)(NiPr$_2$)$_2$(NHtBu)$_2$, W(=O)(NHSiMe$_3$)$_4$, W(=O)(NH(SiHMe$_2$))$_4$, W(=O)(NH(SiMeH$_2$))$_4$, W(=O)(NHiPr)$_2$(N(SiMe$_3$)$_2$)$_2$, and W(=O)(NiPr$_2$)$_2$(N(SiMe$_3$)$_2$)$_2$.

The precursors of Formula I may be synthesized as described in Inorganic Chemistry, Vol. 26, No. 18, 1987. More particularly, M(=O)Cl$_4$ may be reacted with 1 equivalent of MeOH followed by 4 equivalents of the Li or Na salt of the corresponding amine (LiNR$_2$ or NaNR$_2$) to produce M(=O)(NR$_2$)$_4$.

The Group 6 transition metal-containing precursor may have Formula II, M(=O)$_2$(NR$_2$)$_2$, wherein M is Mo or W and each R is independently H, a C1 to C6 alkyl group, or SiR'$_3$, wherein R' is H or a C1 to C6 alkyl group. Preferably, each R is independently H, Me, Et, iPr, or tBu.

Exemplary molybdenum precursors of Formula II include Mo(=O)$_2$(NMe$_2$)$_2$, Mo(=O)$_2$(NMeEt)$_2$, Mo(=O)$_2$(NEt$_2$)$_2$, Mo(=O)$_2$(NiPr$_2$)$_2$, Mo(=O)$_2$(NnPr$_2$)$_2$, Mo(=O)$_2$(NiBu$_2$)$_2$, Mo(=O)$_2$(NnBu$_2$)$_2$, Mo(=O)$_2$(NtBu$_2$)$_2$, Mo(=O)$_2$(NsBu$_2$)$_2$, Mo(=O)$_2$(NtAm$_2$)$_2$, Mo(=O)$_2$(NMe$_2$)(NtBu$_2$), Mo(=O)$_2$(NiPr$_2$)(NtBu$_2$), Mo(=O)$_2$(N(SiMe$_3$)$_2$)$_2$, Mo(=O)$_2$(N(SiHMe$_2$)$_2$)$_2$, Mo(=O)$_2$(N(SiMeH$_2$)$_2$)$_2$, Mo(=O)$_2$(NHMe)$_2$, Mo(=O)$_2$(NHEt)$_2$, Mo(=O)$_2$(NHiPr)$_2$, Mo(=O)$_2$(NHnPr)$_2$, Mo(=O)$_2$(NHiBu)$_2$, Mo(=O)$_2$(NHnBu)$_2$, Mo(=O)$_2$(NHtBu)$_2$, Mo(=O)$_2$(NHsBu)$_2$, Mo(=O)$_2$(NHtAm)$_2$, Mo(=O)$_2$(NHMe)(NtBu$_2$), Mo(=O)$_2$(NiPr$_2$)(NHtBu), Mo(=O)$_2$(NHSiMe$_3$)$_2$, Mo(=O)$_2$(NH(SiHMe$_2$))$_2$, Mo(=O)$_2$(NH(SiMeH$_2$))$_2$, Mo(=O)$_2$(NHiPr)(N(SiMe$_3$)$_2$), and Mo(=O)$_2$(NiPr$_2$)(N(SiMe$_3$)$_2$).

Exemplary tungsten precursors of Formula II include W(=O)$_2$(NMe$_2$)$_2$, W(=O)$_2$(NMeEt)$_2$, W(=O)$_2$(NEt$_2$)$_2$, W(=O)$_2$(NiPr$_2$)$_2$, W(=O)$_2$(NnPr$_2$)$_2$, W(=O)$_2$(NiBu$_2$)$_2$, W(=O)$_2$(NnBU$_2$)$_2$, W(=O)$_2$(NtBu$_2$)$_2$, W(=O)$_2$(NsBu$_2$)$_2$, W(=O)$_2$(NtAm$_2$)$_2$, W(=O)$_2$(NMe$_2$)(NtBu$_2$), W(=O)$_2$(NiPr$_2$)(NtBu$_2$), W(=O)$_2$(N(SiMe$_3$)$_2$)$_2$, W(=O)$_2$(N(SiHMe$_2$)$_2$)$_2$, W(=O)$_2$(N(SiMeH$_2$)$_2$)$_2$, W(=O)$_2$(NHMe)$_2$, W(=O)$_2$(NHEt)$_2$, W(=O)$_2$(NHiPr)$_2$, W(=O)$_2$(NHnPr)$_2$, W(=O)$_2$(NHiBu)$_2$, W(=O)$_2$(NHnBu)$_2$, W(=O)$_2$(NHtBu)$_2$, W(=O)$_2$(NHsBu)$_2$, W(=O)$_2$(NHtAm)$_2$, W(=O)$_2$(NHMe)(NtBu$_2$), W(=O)$_2$(NiPr$_2$)(NHtBu), W(=O)$_2$(NHSiMe$_3$)$_2$, W(=O)$_2$(NH(SiHMe$_2$))$_2$, W(=O)$_2$(NH(SiMeH$_2$))$_2$, W(=O)$_2$(NHiPr)(N(SiMe$_3$)$_2$), and W(=O)$_2$(NiPr$_2$)(N(SiMe$_3$)$_2$).

The precursors of Formula II may be synthesized by reacting M(=O)Cl$_2$ with 1 equivalent of methanol followed by 2 equivalents of the Li or Na salt of the corresponding amine (LiNR$_2$ or NaNR$_2$) to produce M(=O)$_2$(NR$_2$)$_2$.

The Group 6 transition metal-containing precursor may have Formula III, M(=NR)$_2$ (OR)$_2$, wherein M is Mo or W and each R is independently H, a C1 to C6 alkyl group, or SiR'$_3$, wherein R' is H or a C1 to C6 alkyl group. Preferably, each R is independently H, Me, Et, iPr, tBu, or tAmyl.

Exemplary molybdenum precursors of Formula III include Mo(=NMe)$_2$(OMe)$_2$, Mo(=NEt)$_2$(OEt)$_2$, Mo(=NiPr)$_2$(OiPr)$_2$, Mo(=NnPr)$_2$(OnPr)$_2$, Mo(=NiBu)$_2$(OiBu)$_2$, Mo(=NsBu)$_2$(OsBu)$_2$, Mo(=NtBu)$_2$(OtBu)$_2$, Mo(=NnBu)$_2$(OnBu)$_2$, Mo(=NtAm)$_2$(OtAm)$_2$, Mo(=NSiMe$_3$)$_2$(OSiMe$_3$)$_2$, Mo(=NSiHMe$_2$)$_2$(OSiHMe$_2$)$_2$, Mo(=NSiH$_2$Me)$_2$(OSiH$_2$Me)$_2$, Mo(=NMe)$_2$(OtBu)$_2$, Mo(=NEt)$_2$(OiPr)$_2$, Mo(=NiPr)$_2$(OMe)$_2$, Mo(=NiPr)$_2$(OEt)$_2$, Mo(=NiPr)$_2$(OsBu)$_2$, Mo(=NiPr)$_2$(OnBu)$_2$, Mo(=NiPr)$_2$(OiBu)$_2$, Mo(=NiPr)$_2$(OtBu)$_2$, Mo(=NiPr)$_2$(OtAmyl)$_2$, Mo(=NtBu)$_2$(OMe)$_2$, Mo(=NtBu)$_2$(OEt)$_2$, Mo(=NtBu)$_2$(OiPr)$_2$, Mo(=NtBu)$_2$(OnBu)$_2$, Mo(=NtBu)$_2$(OiBu)$_2$, Mo(=NtBu)$_2$(OsBu)$_2$, Mo(=NtBu)$_2$(OtAmyl)$_2$, Mo(=NtAm)$_2$(OMe)$_2$, Mo(=NtAm)$_2$(OEt)$_2$, Mo(=NtAm)$_2$(OiPr)$_2$, Mo(=NtAm)$_2$(OnBu)$_2$, Mo(=NtAm)$_2$(OtBu)$_2$, Mo(=NtAm)$_2$(OiBu)$_2$, Mo(=NtAm)$_2$(OsBu)$_2$, Mo(=NSiMe$_3$)$_2$(OMe)(OEt), Mo(=NSiHMe$_2$)$_2$(OMe)(OEt), Mo(=NSiH$_2$Me)$_2$(OMe)(OEt), Mo(=NSiMe$_3$)(=NtBu)(OMe)$_2$, Mo(=NSiMe$_3$)(=NtBu)(OEt)$_2$, Mo(=NSiMe$_3$)(=NiPr)(OMe)$_2$, and Mo(=NSiMe$_3$)(=NiPr)(OEt)$_2$.

Exemplary tungsten precursors of Formula III include W(=NMe)$_2$(OMe)$_2$, W(=NEt)$_2$(OEt)$_2$, W(=NiPr)$_2$(OiPr)$_2$, W(=NnPr)$_2$(OnPr)$_2$, W(=NiBu)$_2$(OiBu)$_2$, W(=NsBu)$_2$(OsBu)$_2$, W(=NtBu)$_2$(OtBu)$_2$, W(=NnBu)$_2$(OnBu)$_2$, W(=NtAm)$_2$(OtAm)$_2$, W(=NSiMe$_3$)$_2$(OSiMe$_3$)$_2$, W(=NSiHMe$_2$)$_2$(OSiHMe$_2$)$_2$, W(=NSiH$_2$Me)$_2$(OSiH$_2$Me)$_2$, W(=NMe)$_2$(OtBu)$_2$, W(=NEt)$_2$(OiPr)$_2$, W(=NiPr)$_2$(OMe)$_2$, W(=NiPr)$_2$(OEt)$_2$, W(=NiPr)$_2$(OtBu)$_2$, W(=NiPr)$_2$(OnBu)$_2$, W(=NiPr)$_2$(OiBu)$_2$, W(=NiPr)$_2$(OsBu)$_2$, W(=NiPr)$_2$(OtAmyl)$_2$, W(=NtBu)$_2$(OMe)$_2$, W(=NtBu)$_2$(OEt)$_2$, W(=NtBu)$_2$(OiPr)$_2$, W(=NtBu)$_2$(OnBu)$_2$, W(=NtBu)$_2$(OiBu)$_2$, W(=NtBu)$_2$(OsBu)$_2$, W(=NtBu)$_2$(OtAmyl)$_2$, W(=NtAm)$_2$(OMe)$_2$, W(=NtAm)$_2$(OEt)$_2$, W(=NtAm)$_2$(OiPr)$_2$, W(=NtAm)$_2$(OnBu)$_2$, W(=NtAm)$_2$(OtBu)$_2$, W(=NtAm)$_2$(OiBu)$_2$, W(=NtAm)$_2$(OsBu)$_2$, W(=NSiMe$_3$)$_2$(OMe)(OEt), W(=NSiHMe$_2$)$_2$(OMe)(OEt), W(=NSiH$_2$Me)$_2$(OMe)(OEt), W(=NSiMe$_3$)(=NtBu)(OMe)$_2$, W(=NSiMe$_3$)(=NtBu)(OEt)$_2$, W(=NSiMe$_3$)(=NiPr)(OMe)$_2$, and W(=NSiMe$_3$)(=NiPr)(OEt)$_2$.

The precursors of Formula III may be synthesized according to the methods disclosed in Dalton Transactions (2003) (23) 4457-4465. More particularly the ethylene glycol diethyl ether adduct of M(=NR)$_2$X$_2$ may be reacted with LiOR' or NaOR' to produce Mo(=NR)$_2$(OR')$_2$, wherein X is a halide and R and R' are both independently R as defined above but differentiated to indicate where each of R and R' are located on the final product.

The Group 6 transition metal-containing precursor may have Formula IV, M(=O)(OR)$_4$, wherein M is Mo or W and each R is independently H, a C1 to C6 alkyl group, or SiR'$_3$, wherein R' is H or a C1 to C6 alkyl group. Preferably, each R is independently iPr, tBu, sBu, or tAmyl.

Exemplary molybdenum precursors of Formula IV include Mo(=O)(OMe)$_4$, Mo(=O)(OEt)$_4$, Mo(=O)(OiPr)$_4$, Mo(=O)(OnPr)$_4$, Mo(=O)(OiBu)$_4$, Mo(=O)(OnBu)$_4$, Mo(=O)(OtBu)$_4$, Mo(=O)(OsBu)$_4$, Mo(=O)(OtAm)$_4$, Mo(=O)(OMe)$_2$(OtBu)$_2$, Mo(=O)(OiPr)$_2$(OtBu)$_2$, Mo(=O)(OSiMe$_3$)$_4$, Mo(=O)(OSiHMe$_2$)$_4$, Mo(=O)(OSiMeH$_2$)$_4$, and Mo(=O)(OiPr)$_2$(OSiMe$_3$)$_2$.

Exemplary tungsten precursors of Formula IV include W(=O)(OMe)$_4$, W(=O)(OnPr)$_4$, W(=O)(OiBu)$_4$, W(=O)(OnBu)$_4$, W(=O)(OsBu)$_4$, W(=O)(OtAm)$_4$, W(=O)(OMe)$_2$(OtBu)$_2$, W(=O)(OiPr)$_2$(OtBu)$_2$, W(=O)(OSiMe$_3$)$_4$, W(=O)(OSiHMe$_2$)$_4$, W(=O)(OSiMeH$_2$)$_4$, and W(=O)(OiPr)$_2$(OSiMe$_3$)$_2$.

The precursors of Formula IV may be synthesized according to the methods disclosed in the Journal of the American Chemical Society (1981) 103(5) 1305-6. More particularly M$_2$(OR)$_6$ may be reacted with 2 equivalents of O$_2$ to produce Mo(=O)(OR)$_4$. Alternatively, the precursors of Formula IV may be synthesized according to the methods disclosed in Organometallics 1982, 1, 148-155. More particularly, M(=O)Cl$_4$ may be reacted with 4 equivalents of Li or Na salts of the corresponding alcohol (LiOR or NaOR, wherein R is defined as above) to produce M(=O)(OR)$_4$.

The Group 6 transition metal-containing precursor may have Formula V, M(=O)$_2$ (OR)$_2$, wherein M is Mo or W and each R is independently H, a C1 to C6 alkyl group, or SiR'$_3$, wherein R' is H or a C1 to C6 alkyl group. Preferably, each R is independently tBu, sBu, iBu or tAmyl.

Exemplary molybdenum precursors of Formula V include Mo(=O)$_2$(OMe)$_2$, Mo(=O)$_2$(OEt)$_2$, Mo(=O)$_2$(OiPr)$_2$, Mo(=O)$_2$(OnPr)$_2$, Mo(=O)$_2$(OiBu)$_2$, Mo(=O)$_2$(OnBu)$_2$, Mo(=O)$_2$(OtBu)$_2$, Mo(=O)$_2$(OsBu)$_2$, Mo(=O)$_2$(OtAm)$_2$, Mo(=O)$_2$(OMe)(OtBu), Mo(=O)$_2$(OiPr)(OtBu), Mo(=O)$_2$(OSiMe$_3$)$_2$, Mo(=O)$_2$(OSiHMe$_2$)$_2$, Mo(=O)$_2$(OSiMeH$_2$)$_2$, and Mo(=O)$_2$(OtBu)(OSiMe$_3$).

Exemplary tungsten precursors of Formula V include W(=O)$_2$(OMe)$_2$, W(=O)$_2$(OEt)$_2$, W(=O)$_2$(OiPr)$_2$, W(=O)$_2$(OnPr)$_2$, W(=O)$_2$(OiBu)$_2$, W(=O)$_2$(OnBu)$_2$, W(=O)$_2$(OtBu)$_2$, W(=O)$_2$(OsBu)$_2$, W(=O)$_2$(OtAm)$_2$, W(=O)$_2$(OMe)(OtBu), W(=O)$_2$(OiPr)(OtBu), W(=O)$_2$(OSiMe$_3$)$_2$, W(=O)$_2$(OSiHMe$_2$)$_2$, W(=O)$_2$(OSiMeH$_2$)$_2$, and W(=O)$_2$(OtBu)(OSiMe$_3$).

The precursors of Formula V may be synthesized according to the methods disclosed in the Inorganic Chemistry (1984), 23(8), 1021-37. More particularly M$_2$(OR)$_6$ may be reacted with molecular O$_2$ to produce M(=O)$_2$(OR)$_2$. Alternatively the precursors of Formula II may also be synthesized according to the methods disclosed in Organometallics 1982, 1, 148-155. More particularly M(=O)$_2$Cl$_2$ may be reacted with 2 equivalents of Lithium or Sodium salt of the corresponding alcohol (Li—OR or Na—OR) to produce Mo(=O)$_2$(OR)$_2$. In another alternative, the precursors of Formula V may also be synthesized according to the methods disclosed in Inorg. Chem. 1989, 28, 1279-1283. More particularly M(=O)$_3$ may be reacted with the corresponding tetraalkoxysilane (Si(OR)$_4$) to produce Mo(=O)$_2$(OR)$_2$.

Purity of the disclosed Group 6 film forming compositions is preferably higher than 99.9% w/w. The disclosed Group 6 transition film forming compositions may contain any of the following impurities: Mo(=NR)Cl(OR), wherein R is defined as above, alkylamines, dialkylamines, alkylimines, alkoxies, THF, ether, toluene, chlorinated metal compounds, lithium or sodium alkoxy, or lithium or sodium amide. Preferably, the total quantity of these impurities is below 0.1% w/w. The purified product may be produced by sublimation, distillation, and/or passing the gas or liquid through a suitable adsorbent, such as a 4A molecular sieve.

The disclosed Group 6 film forming compositions may also include metal impurities at the ppbw (part per billion weight) level. These metal impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), Vanadium (V) and Zinc (Zn).

Also disclosed are methods for forming Group 6 transition metal-containing layers on a substrate using a vapor deposition process. The method may be useful in the manufacture of semiconductor, photovoltaic, LCD-TFT, or flat panel type devices. The disclosed Group 6 film forming compositions may be used to deposit thin Group 6 transition metal-containing films using any vapor deposition methods known to those of skill in the art, such as Atomic Layer Deposition or Chemical Vapor Deposition. Exemplary CVD methods include thermal CVD, plasma enhanced CVD (PECVD), pulsed CVD (PCVD), low pressure CVD (LP-CVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably ALD, PE-ALD, or spatial ALD in order to provide suitable step coverage and film thickness control.

Figure 1:
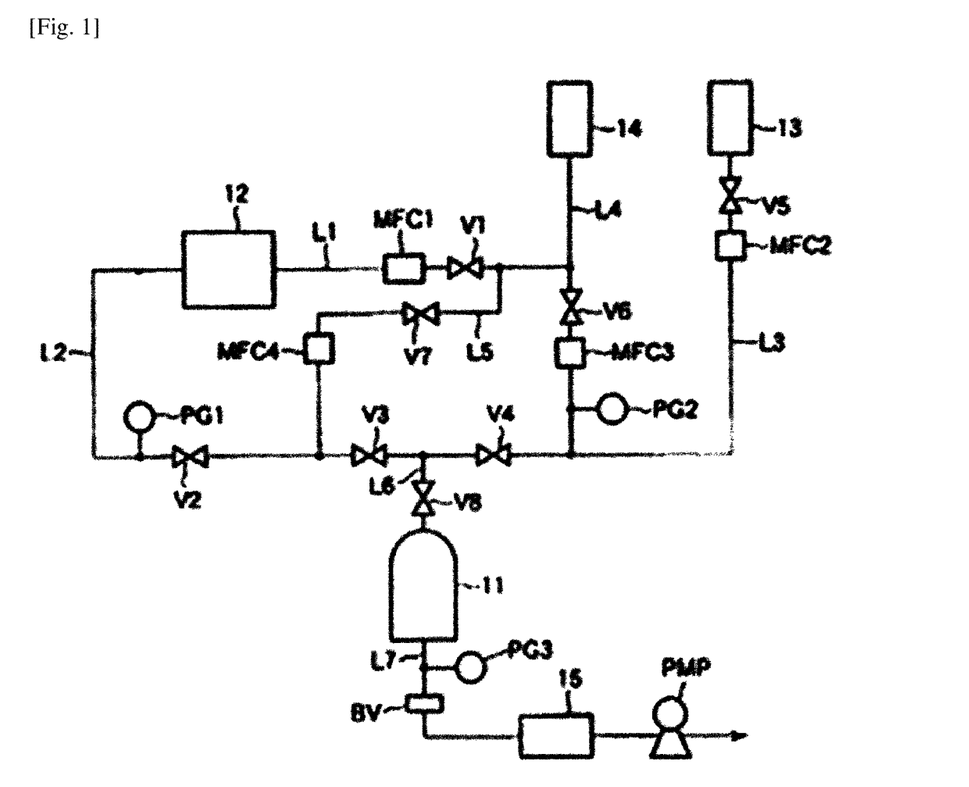
FIG 1 is a block diagram that schematically illustrates an exemplary ALD apparatus.

FIG. 1 is a block diagram that schematically illustrates an example of a vapor deposition apparatus that may be used to form the Group 6 transition metal-containing layer. The apparatus illustrated in FIG. 1 includes a reactor 11, a feed source 12 for the disclosed Group 6 film forming compositions, a feed source 13 for reactant (typically, an oxidizing agent such as oxygen or ozone), and a feed source 14 for an inert gas that can be used as a carrier gas and/or dilution gas. A substrate loading and unloading mechanism (not shown) allows the insertion and removal of deposition substrates in the reactor 11. A heating device (not shown) is provided to reach the reaction temperatures required for reaction of the disclosed compositions.

The Group 6 film forming composition feed source 12 may use a bubbler method to introduce the composition into the reactor 11, and is connected to the inert gas feed source 14 by the line L1. The line L1 is provided with a shutoff valve V1 and a flow rate controller, for example, a mass flow controller MFC1, downstream from this valve. The composition is introduced from its feed source 12 through the line L2 into the reactor 11. The following are provided on the upstream side: a pressure gauge PG1, a shutoff valve V2, and a shutoff valve V3.

The reactant feed source 13 comprises a vessel that holds the reactant in gaseous, liquid, or solid form. Vapors of the reactant are introduced from its feed source 13 through the line L3 into the reactor 11. A shutoff valve V4 is provided in the line L3. This line L3 is connected to the line L2.

The inert gas feed source 14 comprises a vessel that holds inert gas in gaseous form.

The inert gas can be introduced from its feed source through the line L4 into the reactor 11. Line L4 is provided with the following on the upstream side: a shutoff valve V6, a mass flow controller MFC3, and a pressure gauge PG2. The line L4 joins with the line L3 upstream from the shutoff valve V4.

The line L5 branches off upstream from the shutoff valve V1 in the line L1; this line L5 joins the line L2 between the shutoff valve V2 and the shutoff valve V3. The line L5 is provided with a shutoff valve V7 and a mass flow controller MFC4 considered from the upstream side.

The line L6 branches off between the shutoff valves V3 and V4 into the reaction chamber 11. This line L6 is provided with a shutoff valve V8.

A line L7 that reaches to the pump PMP is provided at the bottom of the reactor 11. This line L7 contains the following on the upstream side: a pressure gauge PG3, a butterfly valve BV for controlling the backpressure, and a cold trap 15. This cold trap 15 comprises a tube (not shown) that is provided with a cooler (not shown) over its circumference and is aimed at collecting the tungsten precursor and the related byproducts.

The reactor may be any enclosure or chamber within a device in which deposition methods take place such as without limitation, a parallel-plate type reactor, a cold-wall type reactor, a hot-wall type reactor, a single-wafer reactor, a multi-wafer reactor, or other types of deposition systems under conditions suitable to cause the compounds to react and form the layers.

The reactor contains one or multiple substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (Si-COH) layers, or combinations thereof. Additionally, the wafers may include copper layers or noble metal layers (e.g. platinum, palladium, rhodium, or gold). The wafers may include barrier layers, such as manganese, manganese oxide, etc. Plastic layers, such as poly(3,4-ethylenedioxythiophene)poly (styrenesulfonate) [PEDOT:PSS] may also be used. The layers may be planar or patterned. The disclosed processes may deposit the Group 6-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. For example, a molybdenum oxide film may be deposited onto a TiN layer. In subsequent processing, a zirconium oxide layer may be deposited on the molybdenum layer, a second molybdenum layer may be deposited on the zirconium oxide layer, and a TiN layer may be deposited on the second molybdenum layer, forming a TiN/MoO$_x$/ZrO$_2$/MoO$_x$/TiN stack, with x ranging from 2-3 inclusively, used in DRAM capacitors.

The temperature and the pressure within the reactor are held at conditions suitable for vapor depositions. In other words, after introduction of the vaporized composition into the chamber, conditions within the chamber are such that at least part of the vaporized precursor is deposited onto the substrate to form a Group 6 transition metal-containing film. For instance, the pressure in the reactor may be held between about 1 Pa and about 10$^5$ Pa, more preferably between about 25 Pa and about 10$^3$ Pa, as required per the deposition parameters. Likewise, the temperature in the reactor may be held between about 100° C. and about 500° C., preferably between about 150° C. and about 400° C. One of ordinary skill in the art will recognize that "at least part of the vaporized precursor is deposited" means that some or all of the precursor reacts with or adheres to the substrate.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be heated includes from approximately 100° C. to approximately 500° C. When a plasma deposition process is utilized, the deposition temperature may range from approximately 150° C. to approximately 400° C. Alternatively, when a thermal process is performed, the deposition temperature may range from approximately 200° C. to approximately 500° C.

The disclosed Group 6 film forming compositions may be supplied either in neat form or in a blend with a suitable solvent, such as ethyl benzene, xylene, mesitylene, decane, dodecane. The disclosed compositions may be present in varying concentrations in the solvent.

The neat or blended Group 6 film forming compositions are introduced into a reactor in vapor form by conventional means, such as tubing and/or flow meters. The compound in vapor form may be produced by vaporizing the neat or blended compound solution through a conventional vaporization step such as direct vaporization, distillation, or by bubbling, or by using a sublimator such as the one disclosed in PCT Publication WO2009/087609 to Xu et al. The neat or blended composition may be fed in liquid state to a vaporizer where it is vaporized before it is introduced into the reactor. Alternatively, the neat or blended composition may be vaporized by passing a carrier gas into a container containing the composition or by bubbling the carrier gas into the composition. The carrier gas may include, but is not limited to, Ar, He, N$_2$, and mixtures thereof. Bubbling with a carrier gas may also remove any dissolved oxygen present in the neat or blended composition. The carrier gas and composition are then introduced into the reactor as a vapor.

If necessary, the container of disclosed compositions may be heated to a temperature that permits the composition to be in its liquid phase and to have a sufficient vapor pressure. The container may be maintained at temperatures in the range of, for example, approximately 0° C. to approximately 150° C. Those skilled in the art recognize that the temperature of the container may be adjusted in a known manner to control the amount of composition vaporized.

In addition to the disclosed compositions, a reactant may also be introduced into the reactor. The reactant may be an oxidizing gas such as one of O$_2$, O$_3$, H$_2$O, H$_2$O$_2$, NO, N$_2$O, NO$_2$, oxygen containing radicals such as O. or OH., NO, NO$_2$, carboxylic acids, formic acid, acetic acid, propionic acid, and mixtures thereof. Preferably, the oxidizing gas is selected from the group consisting of O$_2$, O$_3$, H$_2$O, H$_2$O$_2$, oxygen containing radicals thereof such as O. or OH., and mixtures thereof.

Alternatively, the reactant may be a reducing gas such as one of H$_2$, H$_2$CO, NH$_3$, SiH$_4$, Si$_2$H$_6$, Si$_3$H$_8$, (CH$_3$)$_2$SiH$_2$, (C$_2$H$_5$)$_2$SiH$_2$, (CH$_3$)SiH$_3$, (C$_2$H$_5$)SiH$_3$, phenyl silane, N$_2$H$_4$, N(SiH$_3$)$_3$, N(CH$_3$)H$_2$, N(C$_2$H$_5$)H$_2$, N(CH$_3$)$_2$H, N(C$_2$H$_5$)$_2$H, N(CH$_3$)$_3$, N(C$_2$H$_5$)$_3$, (SiMe$_3$)$_2$ NH, (CH$_3$)HNNH$_2$, (CH$_3$)$_2$NNH$_2$, phenyl hydrazine, N-containing molecules, B$_2$H$_6$, 9-borabicyclo[3,3,1]nonane, dihydrobenzenfuran, pyrazoline, trimethylaluminium, dimethylzinc, diethylzinc, radical species thereof, and mixtures thereof. Preferably, the reducing as is H$_2$, NH$_3$, SiH$_4$, Si$_2$H$_6$, Si$_3$H$_8$, SiH$_2$Me$_2$, SiH$_2$Et$_2$, N(SiH$_3$)$_3$, hydrogen radicals thereof, or mixtures thereof.

The reactant may be treated by a plasma, in order to decompose the reactant into its radical form. N$_2$ may also be utilized as a reducing gas when treated with plasma. For instance, the plasma may be generated with a power ranging from about 50 W to about 500 W, preferably from about 100 W to about 400 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

For example, the reactant may be introduced into a direct plasma reactor, which generates plasma in the reaction chamber, to produce the plasma-treated reactant in the reaction chamber. Exemplary direct plasma reactors include the Titan™ PECVD System produced by Trion Technologies. The reactant may be introduced and held in the reaction chamber prior to plasma processing. Alternatively, the plasma processing may occur simultaneously with the introduction of the reactant. In-situ plasma is typically a 13.56 MHz RF inductively coupled plasma that is generated between the showerhead and the substrate holder. The substrate or the showerhead may be the powered electrode depending on whether positive ion impact occurs. Typical applied powers in in-situ plasma generators are from approximately 30 W to approximately 1000 W. Preferably, powers from approximately 30 W to approximately 600 W are used in the disclosed methods. More preferably, the powers range from approximately 100 W to approximately 500 W. The disassociation of the reactant using in-situ plasma is typically less than achieved using a remote plasma source for the same power input and is therefore not as efficient in reactant disassociation as a remote plasma system, which may be beneficial for the deposition of Group 6 transition metal-containing films on substrates easily damaged by plasma.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant O$_2$ may be decomposed into two O. radicals. Preferably, the remote plasma may be generated with a power ranging from about 1 kW to about 10 kW, more preferably from about 2.5 kW to about 7.5 kW.

The vapor deposition conditions within the chamber allow the disclosed composition and the reactant to react and form a Group 6 transition metal-containing film on the substrate. In some embodiments, Applicants believe that plasmatreating the reactant may provide the reactant with the energy needed to react with the disclosed precursors.

Depending on what type of film is desired to be deposited, an additional precursor may be introduced into the reactor. The precursor may be used to provide additional elements to the Group 6 transition metal-containing film. The additional elements may include lanthanides (Ytterbium, Erbium, Dysprosium, Gadolinium, Praseodymium, Cerium, Lanthanum, Yttrium), zirconium, germanium, silicon, titanium, manganese, ruthenium, bismuth, lead, magnesium, aluminum, or mixtures of these. When an additional precursor compound is utilized, the resultant film deposited on the substrate contains the Group 6 transition metal in combination with at least one additional element.

The Group 6 thin film forming compositions and reactants may be introduced into the reactor either simultaneously (chemical vapor deposition), sequentially (atomic layer deposition) or different combinations thereof. The reactor may be purged with an inert gas between the introduction of the composition and the introduction of the reactant. Alternatively, the reactant and the composition may be mixed together to form a reactant/composition mixture, and then introduced to the reactor in mixture form. Another example is to introduce the reactant continuously and to introduce the Group 6 film forming composition by pulse (pulsed chemical vapor deposition).

The vaporized composition and the reactant may be pulsed sequentially or simultaneously (e.g. pulsed CVD) into the reactor. Each pulse may last for a time period ranging from about 0.01 seconds to about 10 seconds, alternatively from about 0.3 seconds to about 3 seconds, alternatively from about 0.5 seconds to about 2 seconds. In another embodiment, the reactant may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds. In another alternative, the vaporized compositions and reactants may be simultaneously sprayed from a shower head under which a susceptor holding several wafers is spun (spatial ALD).

Depending on the particular process parameters, deposition may take place for a varying length of time. Generally, deposition may be allowed to continue as long as desired or necessary to produce a film with the necessary properties. Typical film thicknesses may vary from several angstroms to several hundreds of microns, depending on the specific deposition process. The deposition process may also be performed as many times as necessary to obtain the desired film.

In one non-limiting exemplary CVD type process, the vapor phase of the disclosed Group 6 film forming compositions and a reactant are simultaneously introduced into the reactor. The two react to form the resulting Group 6 transition metal-containing thin film. When the reactant in this exemplary CVD process is treated with a plasma, the exemplary CVD process becomes an exemplary PECVD process. The reactant may be treated with plasma prior or subsequent to introduction into the chamber.

In one non-limiting exemplary ALD type process, the vapor phase of the disclosed Group 6 film forming composition is introduced into the reactor, where it is contacted with a suitable substrate. Excess composition may then be removed from the reactor by purging and/or evacuating the reactor. A desired gas (for example, $H_2$) is introduced into the reactor where it reacts with the adsorbed composition in a self-limiting manner. Any excess reducing gas is removed from the reactor by purging and/or evacuating the reactor. If the desired film is a Group 6 transition metal film, this two-step process may provide the desired film thickness or may be repeated until a film having the necessary thickness has been obtained.

Alternatively, if the desired film contains Group 6 transition metal and a second element, the two-step process above may be followed by introduction of the vapor of an additional precursor into the reactor. The additional precursor will be selected based on the nature of the Group 6 transition metal film being deposited. After introduction into the reactor, the additional precursor is contacted with the substrate. Any excess precursor is removed from the reactor by purging and/or evacuating the reactor. Once again, a desired gas may be introduced into the reactor to react with the adsorbed precursor. Excess gas is removed from the reactor by purging and/or evacuating the reactor. If a desired film thickness has been achieved, the process may be terminated. However, if a thicker film is desired, the entire four-step process may be repeated. By alternating the provision of the Group 6 film forming composition, additional precursor, and reactant, a film of desired composition and thickness can be deposited.

When the reactant in this exemplary ALD process is treated with a plasma, the exemplary ALD process becomes an exemplary PEALD process. The reactant may be treated with plasma prior or subsequent to introduction into the chamber.

In a second non-limiting exemplary ALD type process, the vapor phase of one of the disclosed Group 6 film forming compositions, for example molybdenum di-tertbutylimido di-tertbutoxide [Mo(=NtBu)$_2$(OtBu)$_2$], is introduced into the reactor, where it is contacted with a TiN substrate. Excess composition may then be removed from the reactor by purging and/or evacuating the reactor. A desired gas (for example, $O_3$) is introduced into the reactor where it reacts with the absorbed precursor in a self-limiting manner to form a molybdenum oxide film. Any excess oxidizing gas is removed from the reactor by purging and/or evacuating the reactor. These two steps may be repeated until the molybdenum oxide film obtains a desired thickness, typically around 10 angstroms. $ZrO_2$ may then be deposited on the $MoO_x$ film, wherein x is inclusively 2-3. For example, ZrCp(NMe$_2$)$_3$ may serve as the Zr precursor. The second non-limiting exemplary ALD process described above using Mo(=NtBu)$_2$(OtBu)$_2$ and ozone may then be repeated on the $ZrO_2$ layer, followed by deposition of TiN on the $MoO_x$ layer. The resulting TiN/$MoO_x$/$ZrO_2$/$MoO_x$/TiN stack may be used in DRAM capacitors.

The Group 6 transition metal-containing films resulting from the processes discussed above may include a pure Group 6 transition metal (M=Mn or W), Group 6 transition metal silicide ($M_kSi_l$), Group 6 transition metal oxide ($M_nO_m$), Group 6 transition metal nitride ($M_oN_p$) film, Group 6 transition metal carbide ($M_qC_r$) film, or a Group 6 transition metal carbonitride ($MC_rN_p$) wherein k, l, m, n, o, p, q, and r are integers which inclusively range from 1 to 6. One of ordinary skill in the art will recognize that by judicial selection of the appropriate disclosed Group 6 film forming composition, optional precursors, and reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the Group 6 transition metal-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 400° C. for 3600 seconds under a H-containing atmosphere or an O-containing atmosphere. The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the Group 6 transition metal-containing film. This in turn tends to improve the resistivity of the film.

After annealing, the tungsten-containing films deposited by any of the disclosed processes may have a bulk resistivity at room temperature of approximately 5.5 μohm.cm to approximately 70 μohm.cm, preferably approximately 5.5 μohm.cm to approximately 20 μohm.cm, and more preferably approximately 5.5 μohm.cm to approximately 12 μohm.cm. After annealing, the molybdenum-containing films deposited by any of the disclosed processes may have a bulk resistivity at room temperature of approximately 50 μohm.cm to approximately 1,000 μohm.cm. Room temperature is approximately 20° C. to approximately 28° C. depending on the season. Bulk resistivity is also known as volume resistivity. One of ordinary skill in the art will recognize that the bulk resistivity is measured at room temperature on W or Mo films that are typically approximately 50 nm thick. The bulk resistivity typically increases for thinner films due to changes in the electron transport mechanism. The bulk resistivity also increases at higher temperatures.

In another alternative, the disclosed Group 6 film forming compositions may be used as doping or implantation agents. Part of the disclosed composition may be deposited on top of the film to be doped, such as an indium oxide ($In_2O_3$) film, vanadium dioxide ($VO_2$) film, a titanium oxide film, a copper oxide film, or a tin dioxide ($SnO_2$) film. The molybdenum or tungsten then diffuses into the film during an annealing step to form the molybdenum-doped films {(Mo)$In_2O_3$, (Mo)$VO_2$, (Mo)TiO, (Mo)CuO, or (Mo)$SnO_2$} or tungsten-doped films {(W)$In_2O_3$, (W)$VO_2$, (W)TiO, (W)CuO, or (W)$SnO_2$}. See, e.g., US2008/0241575 to Lavoie et al., the doping method of which is incorporated herein by reference in its entirety. Alternatively, high energy ion implantation using a variable energy radio frequency quadrupole implanter may be used to dope the molybdenum or tungsten of the disclosed compositions into a film. See, e.g., Kensuke et al., JVSTA 16(2) March/April 1998, the implantation method of which is incorporated herein by reference in its entirety. In another alternative, plasma doping, pulsed plasma doping or plasma immersion ion implantation may be performed using the disclosed compositions. See, e.g., Felch et al., Plasma doping for the fabrication of ultra-shallow junctions Surface Coatings Technology, 156 (1-3) 2002, pp. 229-236, the doping method of which is incorporated herein by reference in its entirety.

EXAMPLES

The following non-limiting examples are provided to further illustrate embodiments of the invention. However, the examples are not intended to be all inclusive and are not intended to limit the scope of the inventions described herein.

Synthesis Example 1

Mo(=NtBu)$_2$(OiPr)$_2$

MoCl$_2$(=NtBu)$_2$ was synthesized by mixing 1 molar equivalent of Na$_2$MoO$_4$ with 700 mL of dimethyl ether at 0° C. under mechanical stirring. 4 molar equivalents of NEt$_3$ was added dropwise to the mixture for 10 minutes. The addition funnel was rinsed with 100 mL of dimethyl ether, which was added to the mixture. 9 molar equivalents of SiMe$_3$Cl was added dropwise to the mixture for 1 hour. The addition funnel was rinsed with 100 mL of dimethyl ether, which was added to the mixture. 2 molar equivalents of tBuNH$_2$ was added dropwise to the mixture for 30 minutes. After one night at room temperature (approximately 23° C.), the resulting yellow suspension was heated to 70° C. for 10 hours. The suspension was cooled to room temperature and filtered. Solvent was removed under vacuum and resulting gold powder washed with pentane.

Figure 2:
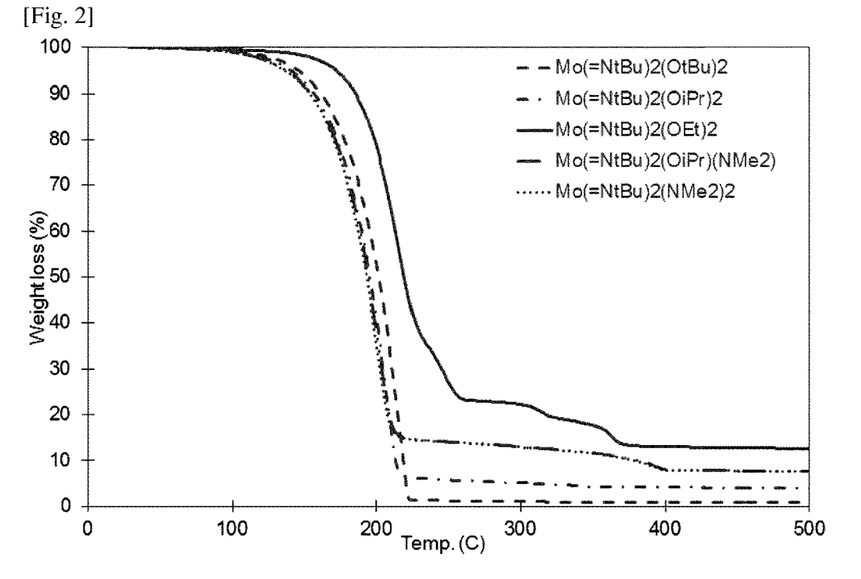
FIG. 2 is a ThermoGravimetric Analysis (TGA) graph demonstrating the percentage of weight loss with increasing temperature of Mo(=NtBu)$_2$(OtBu)$_2$, Mo(=NtBu)$_2$(OiPr)$_2$, Mo(=NtBu)$_2$(OEt)$_2$, Mo(=NtBu)$_2$(OiPr)(NMe$_2$), and Mo(=NtBu)$_2$(NMe$_2$)$_2$.

1 molar equivalent of MoCl$_2$(=NtBu)$_2$ was mixed with tetrahydrofuran (THF) at −78° C. under mechanical stirring. 2 molar equivalents of Li(OiPr) in THF was added dropwise to the mixture. After one night at room temperature, the solvent was removed under vacuum. The resulting product was rinsed with pentane and filtered. Solvent was removed under vacuum distillation and the crude product purified by vacuum distillation. The Mo(=NtBu)$_2$(OiPr)$_2$ produced was a gold liquid. The open cup Thermo-Gravimetric Analysis (TGA) graph is provided in FIG. 2. Vapor pressure at 1 Torr is 91° C.

Synthesis Example 2

Mo(=NtBu)$_2$(OtBu)$_2$ 1 molar equivalent of MoCl$_2$(=NtBu)$_2$ was mixed with tetrahydrofuran (THF) at −78° C. under mechanical stirring. 2.8 molar equivalents of Li(OtBu) in THF was added dropwise to the mixture. After one night at room temperature, the solvent was removed under vacuum. The resulting product was rinsed with 500 mL of pentane and filtered. Solvent was removed under vacuum distillation and the crude product purified by vacuum distillation. The Mo(=NtBu)$_2$(OiPr)$_2$ produced was a yellow oil. The open cup TGA graph is provided in FIG. 2. Vapor pressure at 1 Torr is 93° C.

$^1$H-NMR $\delta_H$: 9.00 ppm (s, 9H, N—C—(C$\underline{H}_3$)$_3$), 9.28 ppm (s, 9H, O—C—(C$\underline{H}_3$)$_3$).

Figure 3:
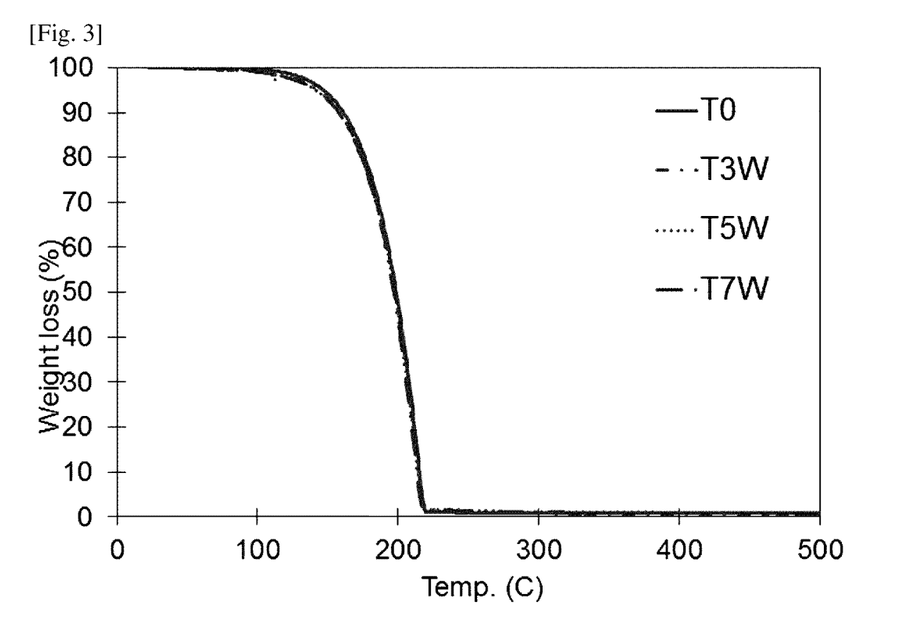
FIG 3 is a TGA graph demonstrating the percentage of weight loss with increasing temperature of Mo(=NtBu)$_2$(OtBu)$_2$ before and after undergoing 100° C. stability testing.

The stability of Mo(=NtBu)$_2$(OtBu)$_2$ was tested by placing the sample in a dry 100° C. heater for 7 weeks. The product became very slightly darker, but as shown in FIG. 3, there was no increase in residue via TGA.

Synthesis Example 3

Mo(=NtBu)$_2$(OEt)$_2$ 1 molar equivalent of Mo(=NtBu)$_2$(NMe$_2$)$_2$ was mixed with tetrahydrofuran (THF) at −78° C. under mechanical stirring. 2 molar equivalents of EtOH was added dropwise to the mixture. After one night at room temperature, the solvent was removed under vacuum and the resulting orange oil purified by vacuum distillation. The purified Mo(=NtBu)$_2$ (OEt)$_2$ produced was a brown wax. The open cup TGA graph is provided in FIG. 2. Vapor pressure at 1 Torr is 129° C.

Synthesis Example 4

Mo(=O)$_2$(N(SiMe$_3$)$_2$)$_2$ 1 molar equivalent of MoCl$_2$(=O)$_2$ was mixed with ether at −78° C. under mechanical stirring. 2 molar equivalents of Na(N(SiMe$_3$)$_2$)$_2$ in ether was added dropwise to the mixture. After one night at room temperature, the resulting product was filtered and purified by vacuum distillation. The Mo(=O)$_2$(N(SiMe$_3$)$_2$)$_2$ produced was a yellow colored liquid. The open cup TGA graph is provided in FIG. 2.

Comparative Synthesis Example

Mo(=NtBu)$_2$(NMe$_2$)$_2$ 1 molar equivalent of MoCl$_2$(=NtBu)$_2$ was mixed with tetrahydrofuran (THF) at −78° C. under mechanical stirring. 2 molar equivalents of Li(NMe$_2$)$_2$ in THF was added dropwise to the mixture. After one night at room temperature, the solvent was removed under vacuum. The resulting product was rinsed with 300 mL of pentane and filtered. Solvent was removed under vacuum distillation and the crude product purified by vacuum distillation. The Mo(=NtBu)$_2$(OiPr)$_2$ produced was an orange liquid. The open cup TGA graph is provided in FIG. 2. Vapor pressure at 1 Torr is 77° C.

Example 1

A typical ALD system, shown in FIG. 1, was used to perform ALD deposition of a molybdenum oxide film. The pressure and temperature of the reactor were kept at 0.356 Torr and 250° C., respectively. The Mo(=NtBu)$_2$(OtBu)$_2$ source was stored in a canister maintained at 75° C. The precursor was delivered to the reactor for 1, 5, or 7 second using 85 sccm of Argon carrier gas, followed by a 30 second Argon purge. 500 sccm of the O$_3$ reactant was then delivered to the reactor for 1 second followed by a 30 second Argon purge. The resulting MoO$_2$ film was deposited at a rate of approximately 0.4 Å/cycle. The resulting MoO$_2$ film contained approximately 24% Mo, 73% O, 2% N and less than 1% C as determined by X-ray Photoelectron Spectroscopy (XPS). X ray diffraction of the resulting film showed Mo$^{(+4)}$O$_2$, which is surprising because the precursor is Mo$^{(+6)}$. Mo$^{(+6)}$ should not be reduced to Mo$^{(+4)}$ in the presence of the strong O$_3$ oxidizer. Applicants believe that some metal Mo(0) may also be deposited, possibly in parasitic CVD mode, which reacts with Mo$^{(+6)}$O$_3$ and reduces it to Mo$^{(+4)}$O$_2$. The MoO$_2$ film may reduce work function of the film and, possibly due to the rutile phase, may lead to lower leakage current in a DRAM stack.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

The invention claimed is:

1. A Group 6 film forming composition comprising a Group 6 transition metal-containing precursor having the formula:

Mo(=O)(NR$_2$)$_4$ wherein each R is independently H, a C1 to C6 alkyl group, or SiR'$_3$,
wherein R' is H or a C1 to C6 alkyl group.

2. The Group 6 film forming composition of claim 1, wherein each R is independently selected from the group consisting of H, Me, Et, nPr, iPr, nBu, iBu, sBu, tBu, tAmyl and SiMe$_3$.

3. A method of depositing of a Group 6 transition metal-containing film on a substrate, comprising the steps of: introducing a vapor of the Group 6 film forming composition of claim 1 into a reactor having a substrate disposed therein and depositing at least part of the Group 6 transition metal-containing precursor onto the substrate.

4. The Group 6 film forming composition of claim 1, wherein the Group 6 transition metal-containing precursor is selected from the group consisting of Mo(=O)(NMe$_2$)$_4$, Mo(=O)(NMeEt)$_4$, Mo(=O)(Net$_2$)$_4$, Mo(=O)(NiPr$_2$)$_4$, Mo(=O)(NnPr$_2$)$_4$, Mo(=O)(NiBu$_2$)$_4$, Mo(=O)(NnBu$_2$)$_4$, Mo(=O)(NtBu$_2$)$_4$, Mo(=O)(NsBu$_2$)$_4$, and Mo(=O)(NtAm$_2$)$_4$.

5. The Group 6 film forming composition of claim 1, wherein the Group 6 transition metal-containing precursor is selected from the group consisting of Mo(=O)(N(SiMe$_3$)$_2$)$_4$, Mo(=O)(N(SiHMe$_2$)$_2$)$_4$, and Mo(=O)(N(SiMeH$_2$)$_2$)$_4$.

6. The Group 6 film forming composition of claim 1, wherein the Group 6 transition metal-containing precursor is selected from the group consisting of Mo(=O)(NHMe)$_4$, Mo(=O)(NHEt)$_4$, Mo(=O)(NHiPr)$_4$, Mo(=O)(NHnPr)$_4$, Mo(=O)(NHiBu)$_4$, Mo(=O)(NHnBu)$_4$, Mo(=O)(NHtBu)$_4$, Mo(=O)(NHsBu)$_4$, and Mo(=O)(NHtAm)$_4$.

7. The Group 6 film forming composition of claim 1, wherein the Group 6 transition metal-containing precursor is selected from the group consisting of Mo(=O)(NMe$_2$)$_2$(NtBu$_2$)$_2$ and Mo(=O)(NiPr$_2$)$_2$(NtBu$_2$)$_2$.

8. The Group 6 film forming composition of claim 1, wherein the Group 6 transition metal-containing precursor is selected from the group consisting of Mo(=O)(NHSiMe$_3$)$_4$, Mo(=O)(NH(SiHMe$_2$))$_4$, Mo(=O)(NH(SiMeH$_2$))$_4$, Mo(=O)(NHiPr)$_2$(N(SiMe$_3$)$_2$)$_2$, and Mo(=O)(NiPr$_2$)$_2$(N(SiMe$_3$)$_2$)$_2$.

9. The method of claim 3, wherein each R is independently selected from the group consisting of H, Me, Et, nPr, iPr, nBu, iBu, sBu, tBu, tAmyl and SiMe$_3$.

10. The method of claim 3, further comprising introducing at least one reactant into the reactor.

11. The method of claim 10, wherein the reactant is selected from the group consisting of H$_2$, H$_2$CO N$_2$H$_4$, NH$_3$, SiH$_4$, Si$_2$H$_6$, Si$_3$H$_8$, SiH$_2$Me$_2$, SiH$_2$Et$_2$, N(SiH$_3$)$_3$, hydrogen radicals thereof, and mixtures thereof.

12. The method of claim 10, wherein the reactant is selected from the group consisting of: O$_2$, O$_3$, H$_2$O, H$_2$O$_2$, NO, N$_2$O, NO$_2$, oxygen radicals thereof, and mixtures thereof.

13. The method of claim 10, wherein the Group 6 film forming composition and the reactant are introduced into the reactor simultaneously and the reactor is configured for chemical vapor deposition.

14. The method of claim 10, wherein the Group 6 film forming composition and the reactant are introduced into the chamber sequentially and the reactor is configured for atomic layer deposition.

15. The method of claim 8, wherein the Group 6 transition metal-containing precursor is selected from the group consisting of Mo(=O)(NMe$_2$)$_4$, Mo(=O)(NMeEt)$_4$, Mo(=O)(Net$_2$)$_4$, Mo(=O)(NiPr$_2$)$_4$, Mo(=O)(NnPr$_2$)$_4$, Mo(=O)(NiBu$_2$)$_4$, Mo(=O)(NnBu$_2$)$_4$, Mo(=O)(NtBu$_2$)$_4$, Mo(=O)(NsBu$_2$)$_4$, and Mo(=O)(NtAm$_2$)$_4$.

16. The method of claim 3, wherein the Group 6 transition metal-containing precursor is selected from the group consisting of $Mo(=O)(N(SiMe_3)_2)_4$, $Mo(=O)(N(SiHMe_2)_2)_4$, and $Mo(=O)(N(SiMeH_2)_2)_4$.

17. The method of claim 3, wherein the Group 6 transition metal-containing precursor is selected from the group consisting of $Mo(=O)(NHMe)_4$, $Mo(=O)(NHEt)_4$, $Mo(=O)(NHiPr)_4$, $Mo(=O)(NHnPr)_4$, $Mo(=O)(NHiBu)_4$, $Mo(=O)(NHnBu)_4$, $Mo(=O)(NHtBu)_4$, $Mo(=O)(NHsBu)_4$, and $Mo(=O)(NHtAm)_4$.

18. The method of claim 3, wherein the Group 6 transition metal-containing precursor is selected from the group consisting of $Mo(=O)(NMe_2)_2(NtBu_2)_2$ and $Mo(=O)(NiPr_2)_2(NtBu_2)_2$.

19. The method of claim 3, wherein the Group 6 transition metal-containing precursor is selected from the group consisting of $Mo(=O)(NHSiMe_3)_4$, $Mo(=O)(NH(SiHMe_2))_4$, $Mo(=O)(NH(SiMeH_2))_4$, $Mo(=O)(NHiPr)_2(N(SiMe_3)_2)_2$, and $Mo(=O)(NiPr_2)_2(N(SiMe_3)_2)_2$.

* * * * *